US007467361B2

(12) United States Patent
Kakui

(10) Patent No.: US 7,467,361 B2
(45) Date of Patent: Dec. 16, 2008

(54) PIPELINE HIGH-LEVEL SYNTHESIS SYSTEM AND METHOD

(75) Inventor: Shingo Kakui, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 11/600,047

(22) Filed: Nov. 16, 2006

(65) Prior Publication Data

US 2007/0234267 A1 Oct. 4, 2007

(30) Foreign Application Priority Data

Mar. 31, 2006 (JP) ............................. 2006-100546

(51) Int. Cl.
*G06F 17/50* (2006.01)
(52) U.S. Cl. .................. 716/3; 716/7; 716/18
(58) Field of Classification Search ................. 716/3, 716/7, 18
See application file for complete search history.

(56) References Cited

U.S. PATENT DOCUMENTS

| 5,274,793 | A * | 12/1993 | Kuroda et al. .................. 716/18 |
| 2001/0034876 | A1 * | 10/2001 | Panchul et al. ................. 716/18 |
| 2003/0212963 | A1 * | 11/2003 | Hakewill et al. ................ 716/1 |
| 2004/0237056 | A1 | 11/2004 | Okada |
| 2005/0077918 | A1 * | 4/2005 | Teifel et al. ................... 326/41 |
| 2006/0101369 | A1 * | 5/2006 | Wang et al. .................... 716/17 |
| 2007/0294548 | A1 * | 12/2007 | Jacobson et al. ............. 713/300 |

FOREIGN PATENT DOCUMENTS

| JP | 8-44773 | 2/1996 |
| JP | 2002-269162 | 9/2002 |
| JP | 2003-30261 | 1/2003 |

OTHER PUBLICATIONS

Halambe et al., "Architecture Exploration of Parameterizable EPIC SOC Architectures", Proceedings of Design, Automation and Test in Europe Conference and Exhibition, Mar. 27-30, 2000, p. 748.*
Ohashi et al., "Heuristic Assignment-Driven Scheduling for Data-Path Synthesis", IEEE International Symposium on Circuits and Systems, vol. 4, 2002, pp. IV-703-IV-706.*

* cited by examiner

*Primary Examiner*—Phallaka Kik
(74) *Attorney, Agent, or Firm*—Finnegan, Henderson, Farabow, Garrett & Dunner, L.L.P.

(57) ABSTRACT

According to one embodiment, a pipeline high-level synthesis system receives a high-level description and performs pipeline high-level synthesis for its loop description part to generate a pipelined circuit having a structure in which a plurality of combinational logic parts serially arranged are separated by pipeline registers. If a memory access conflict is caused by a plurality of combinational logic parts including memory accesses in the circuit generated by the first circuit section, the system allows the logic parts in which a memory access conflict occurs to access a memory through a shift register having a size corresponding to the combinational logic parts.

10 Claims, 8 Drawing Sheets

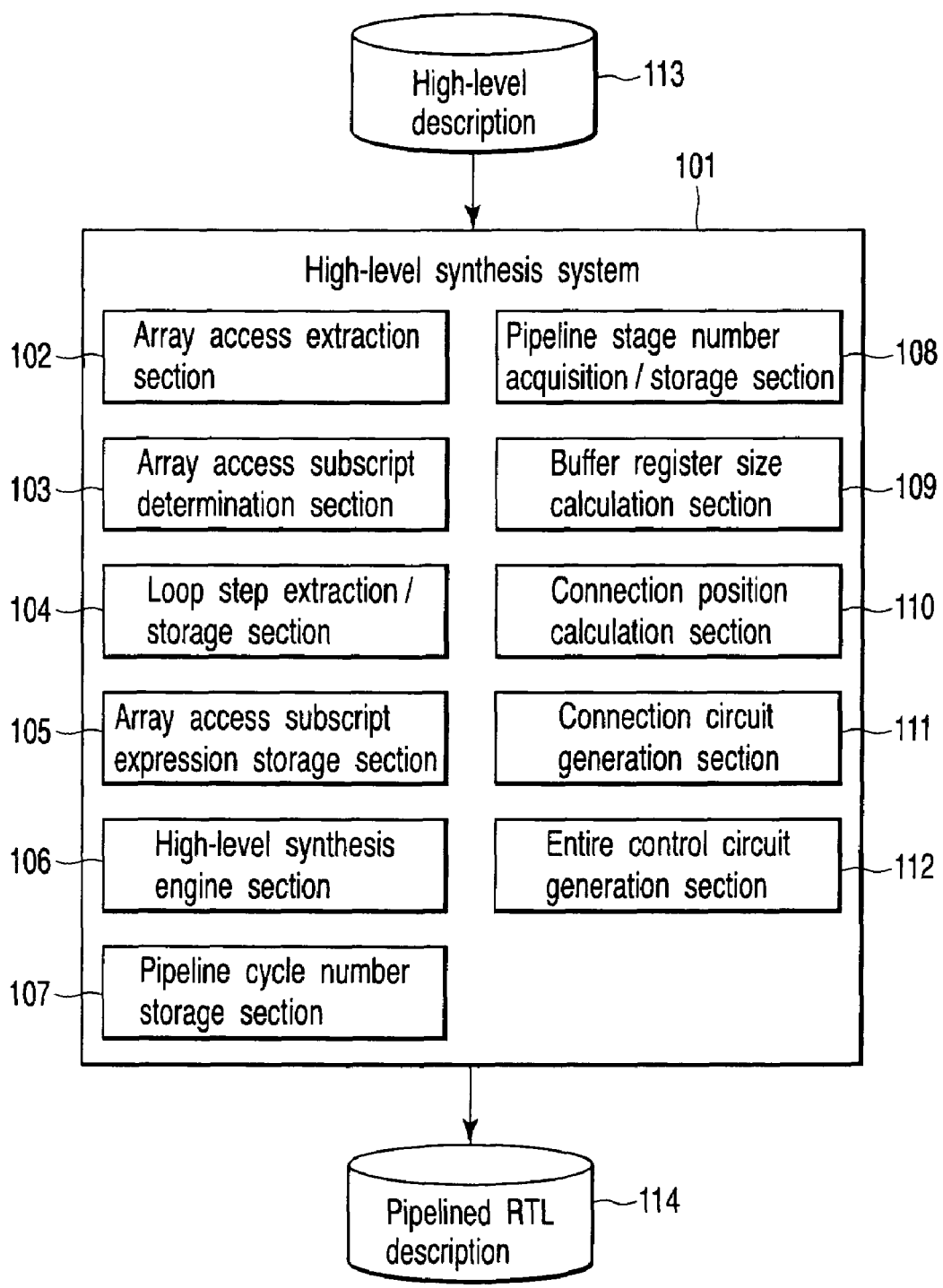
F I G. 1

```
for (int i=0; i<N; i++) {
    . . .
    . . .    =A[i];
    . . .
    . . .
    . . .    =A[i+5];
    . . .
}
```

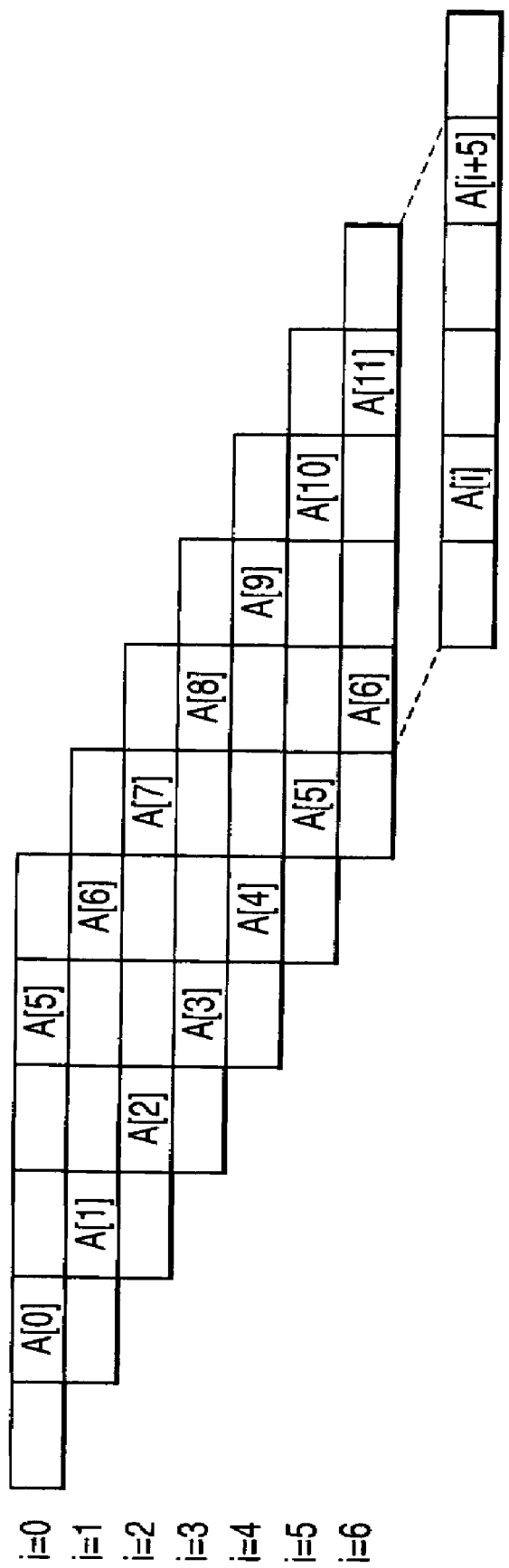
F I G. 5

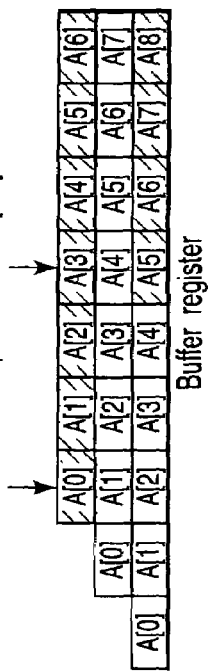
F I G. 6 D
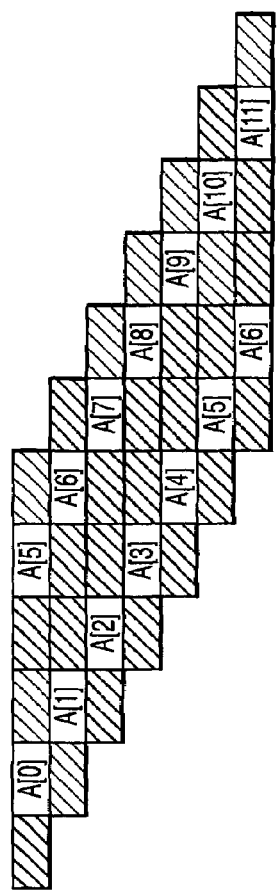
F I G. 6 E
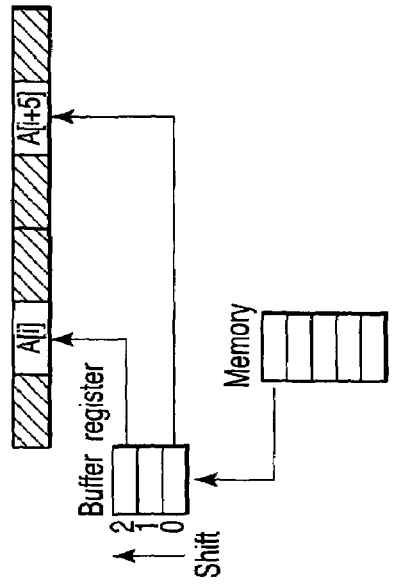
F I G. 6 A
F I G. 6 B
```
for (i=0; i<N; i++) {
  ... = A[i];
  ... = A[i+5];
}
```
C2-C1=5
n<C1-C2>=3
m=1
s=1
Buffer amount=|C2-C1-(n<C1-C2>/m)×s|+1=3
Legister connection position
Connection position of A[i]=C2-C1-(n<C1-C2>/m)×s=2
Connection position of A[i+5]=C2-C2-(n<C2-C2>/m)×s=0
F I G. 6 C

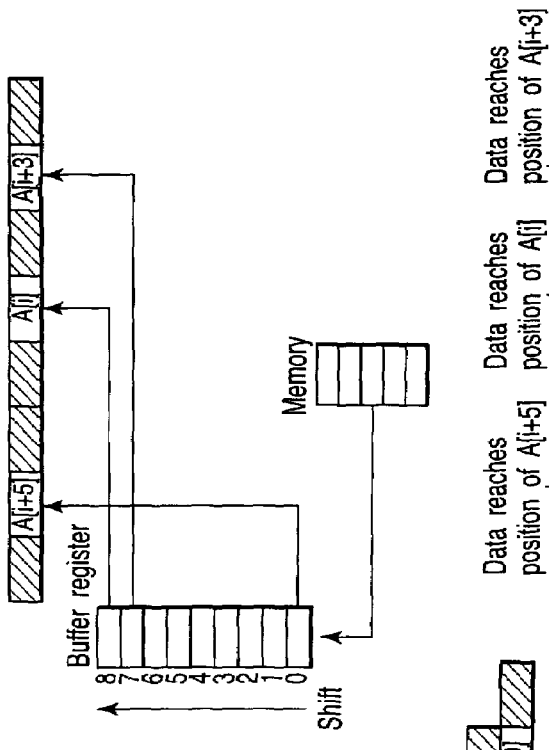
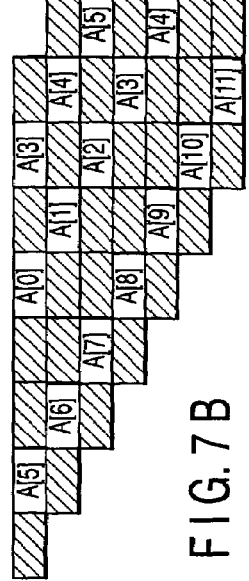
FIG. 7A
FIG. 7B
FIG. 7C
FIG. 7D
FIG. 7E

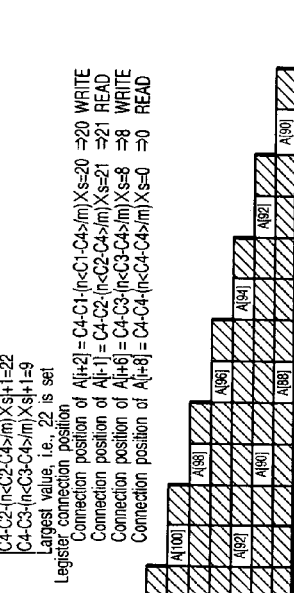
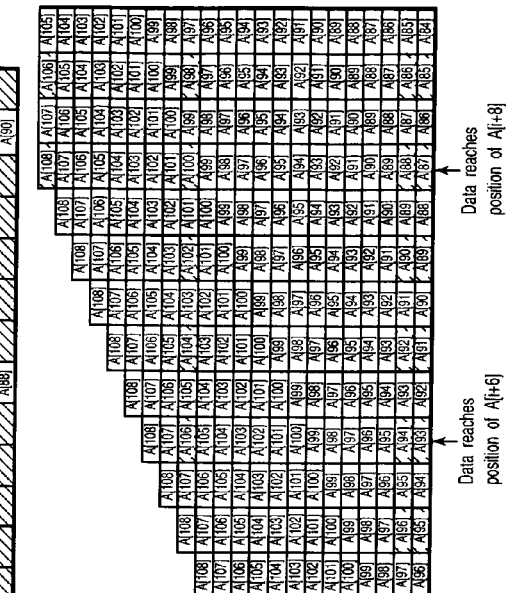
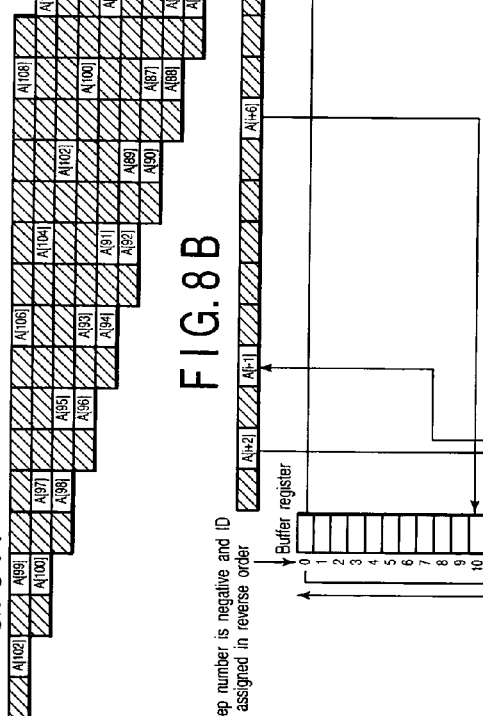
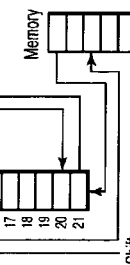

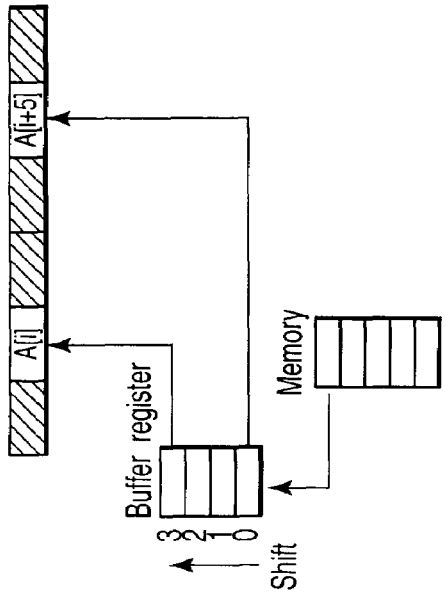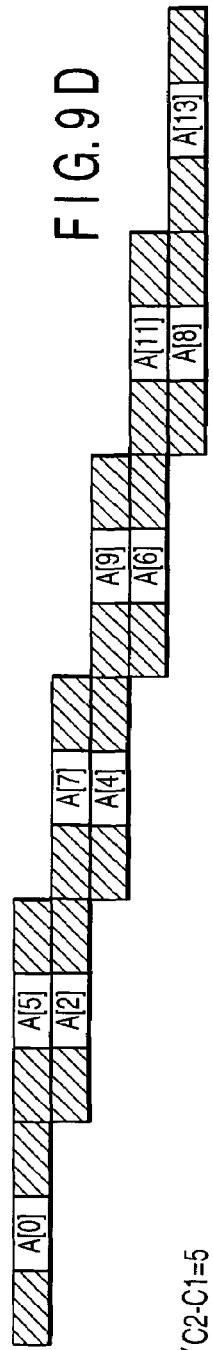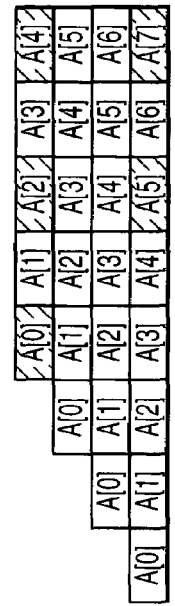
FIG. 9A  FIG. 9B  FIG. 9C  FIG. 9D  FIG. 9E

PIPELINE HIGH-LEVEL SYNTHESIS SYSTEM AND METHOD

CROSS-REFERENCE TO RELATED APPLICATIONS

This application is based upon and claims the benefit of priority from Japanese Patent Application No. 2006-100546, filed Mar. 31, 2006, the entire contents of which are incorporated herein by reference.

BACKGROUND

1. Field

One embodiment of the invention relates to a pipeline high-level synthesis system and a pipeline high-level synthesis method which receives a high-level description as an input to thereby generate a pipelined circuit.

2. Description of the Related Art

As is known, in the case of a current high-level synthesis tool, when two or more accesses are generated for the same array in a loop, it becomes basically impossible to realize pipeline synthesis. In this case, satisfactory performance cannot be obtained, resulting in abandonment of a high-level design, or involving high-cost update of the high-level description to be input to the high-level synthesis system. In particular, such a problem is prominent in video image processing.

Jpn. Pat. Appln. Publication No. 2003-30261 discloses a technique that prevents an access conflict between threads when a plurality of threads operating in parallel concurrently access a shared memory. However, the above patent document does not refer to a technique in which a circuit is pipelined for a desired performance, that is, it does not disclose a technical concept purposed for the realization of a one-cycle pipeline at all.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1, which shows an embodiment of the present invention, is a block diagram showing a configuration of a pipeline high-level synthesis system;

FIG. 5 is a view for explaining a memory access conflict for which the high-level synthesis system according to the present embodiment performs pipeline high-level synthesis;

FIGS. 6A to 6E show a first concrete example of pipeline high-level synthesis performed by the high-level synthesis system according to the present embodiment;

FIGS. 7A to 7E show a second concrete example of pipeline high-level synthesis performed by the high-level synthesis system according to the present embodiment;

FIGS. 8A to 8E show a third concrete example of pipeline high-level synthesis performed by the high-level synthesis system according to the present embodiment; and FIGS. 9A to 9E show a fourth concrete example of pipeline high-level synthesis performed by the high-level synthesis system according to the present embodiment.

DETAILED DESCRIPTION

Figure 2:
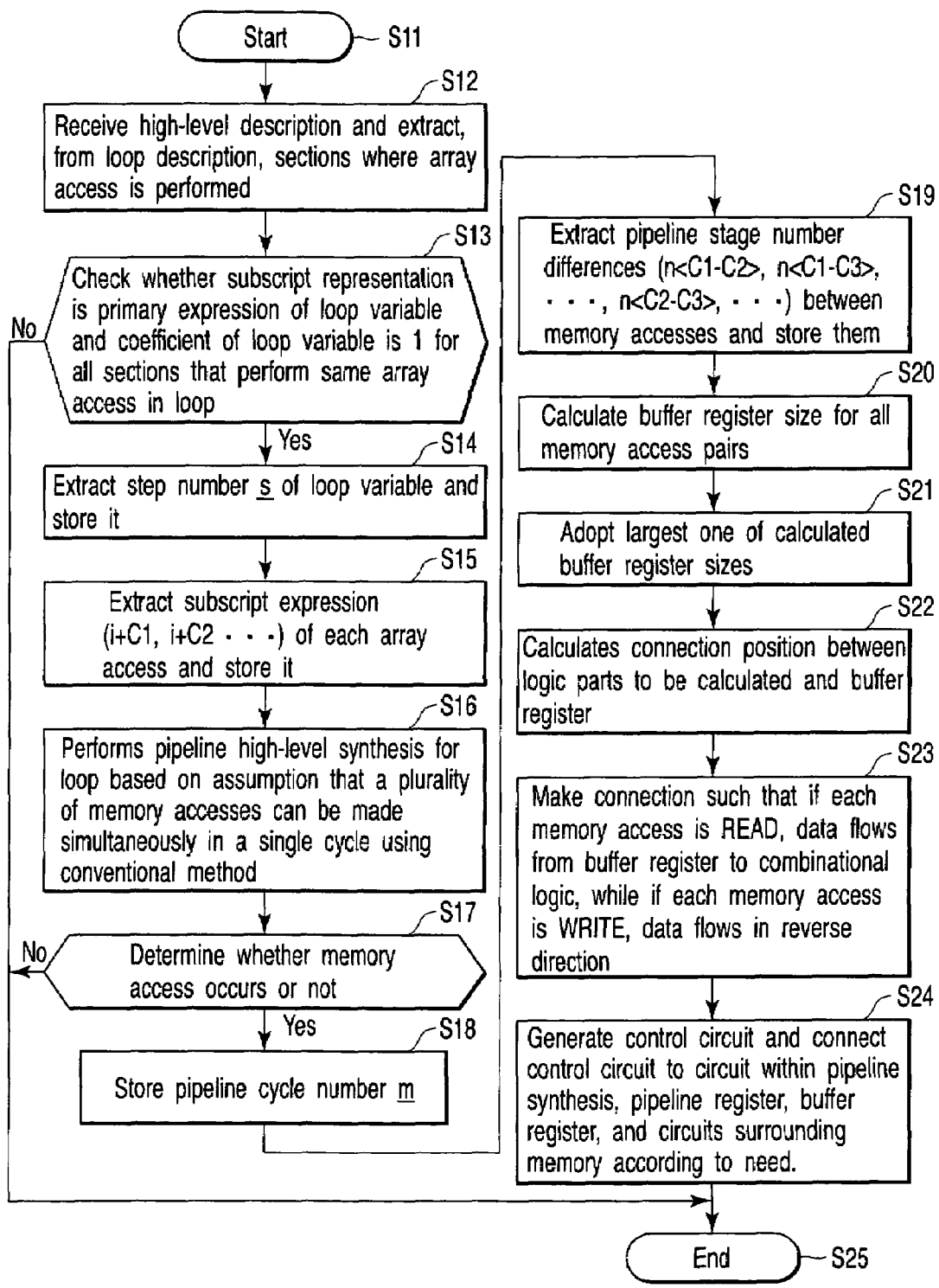
FIG. 2 is a flowchart for explaining the processing operation of the high-level synthesis system according to the present embodiment.

Various embodiments according to the invention will be described hereinafter with reference to the accompanying drawings. In general, according to one embodiment of the invention, a pipeline high-level synthesis system receives a high-level description and performs pipeline high-level synthesis for its loop description part to generate a pipelined circuit having a structure in which a plurality of combinational logic parts serially arranged are separated by pipeline registers. If a memory access conflict is caused by a plurality of combinational logic parts including memory accesses in the circuit generated by the first circuit section, the system allows the logic parts in which a memory access conflict occurs to access a memory through a shift register having a size corresponding to the combinational logic parts.

FIG. 1 shows a pipeline high-level synthesis system according to the present embodiment. The high-level synthesis system 101 receives a high-level description 113 (written in a language such as C or System C in most cases) as an input and generates a pipelined circuit (RTL [register transfer level] description) 114 having a higher throughput.

In order to achieve such a function, the high-level synthesis system 101 includes an array access extraction section 102, an array access subscript determination section 103, a loop step extraction/storage section 104, an array access subscript expression storage section 105, a high-level synthesis engine section 106, a pipeline cycle number storage section 107, a pipeline stage number acquisition/storage section 108, a buffer register size calculation section 109, a connection position calculation section 110, a connection circuit generation section 111, an entire control circuit generation section 112, and the like.

The array access extraction section 102 extracts array accesses in a loop description to be pipelined. The array access subscript determination section 103 determines subscript of the extracted array access. The loop step extraction/storage section 104 extracts incremental or decremental step number of loop variables of loop description and stores it. The array access subscript expression storage section 105 stores the numeric expression of subscript in the array access part.

The high-level synthesis engine section 106 performs high-level synthesis in the same manner as in typical high-level synthesis processing except that it ignores a memory access conflict. The pipeline cycle number storage section 107 stores a pipeline cycle number which is specified by a user or automatically calculated. The pipeline stage number acquisition/storage section 108 acquires all pipeline stage number differences between memory accesses in a circuit which has been synthesized with a memory access conflict temporarily ignored and stores them.

The buffer register size calculation section 109 calculates a required buffer register size based on the obtained information. The connection position calculation section 110 calculates the connection position between a logic in a pipelined circuit and a register. The connection circuit generation section 111 generates a connection circuit based on the connection position calculation result and depending on whether a memory access is READ or WRITE. The entire control circuit generation section 112 generates a circuit which controls a processing procedure so that thus created entire circuit including the pipelined circuit, buffer register, and memory operates normally.

Next, processing operation of the high-level synthesis system 101 will be described with reference to FIG. 2. In the following, the functions of the components shown in FIG. 1 will be additionally described. FIGS. 3 to 5 are also referred to if necessary.

Upon start of the processing (block S11), the high-level synthesis system 101 receives a high-level description written in C language or the like and extracts array access parts from a loop description (block S12).

Figures 3, 4:
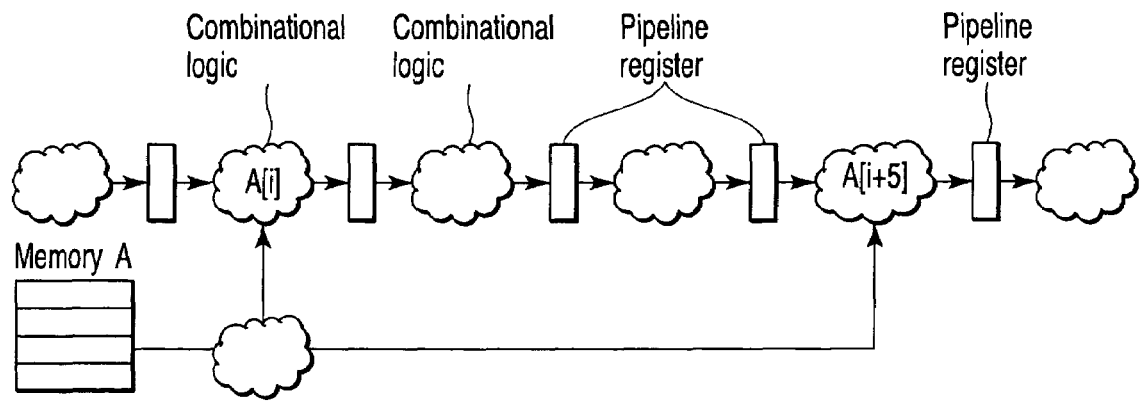
FIG. 3 is a view for explaining an example of a loop description part received by the high-level synthesis system according to the present embodiment.
FIG. 4 is a view for explaining an example of a pipelined circuit obtained as a result of pipeline high-level synthesis performed by the high-level synthesis system according to the present embodiment.

Although not shown in FIG. 2, the high-level synthesis system 101 treats an array having a large number of elements as a memory and treats an array having a small number of elements as a register, in general. This is because when the register is used, the size of the circuit becomes significantly large. On the other hand, the use of the register allows simultaneous access to a plurality of array elements.

Therefore, in the case where the array that has been extracted at this time has a small number of elements and accordingly there is no problem if it is used as a register, it is unnecessary to carry out the following processing. Further, a pipelined structure is supposed to be implemented without problem because the array is a register. That is, the following block needs to be carried out in the case where the array has a large number of elements and it must be treated as a memory.

The "loop" indicates, as shown in FIG. 3, a description such as "for loop" in C language. Note that not only "for loop", but also "while loop" or "do-while loop" may be received.

The high-level synthesis system 101 then checks for all sections in a loop where the same array access is performed to determine whether the subscript representation is a primary expression of the loop variable and the coefficient of the loop variable is 1 (block S13).

If it is determined to be "NO" (all the subscript representations are not a primary expression of the loop variable or all the coefficients are not 1), the following blocks cannot be applied, resulting in abandonment of a pipelined structure according to the method of the present embodiment and shift to the conventional method. That is, the processing according to the present embodiment is ended (block S25).

If it is determined to be "YES" in block S13, the high-level synthesis system 101 extracts the step number $s$ of the loop variable and stores it (block S14). In, e.g., "for loop", the step number $s$ of the loop variable is described as "for (int i=0; i<100; i++)". In this case, the value of loop variable i is increased by 1 for each iteration, so that the step number $s$ is 1.

Similarly, "for (int i=100; i>0; i—)" indicates that the step number $s$ is −1, and "for (int i=100; i>0; i−=5)" indicates that the step number $s$ is −5.

Then, the high-level synthesis system 101 extracts a subscript expression of each array access part and stores it (block S15). For example, assume that the array variable name is A. In this case, if there is a representation "A [i+3]", [i+3] is the subscript expression. Such a subscript expression is extracted from all array access parts in a loop.

Then, the high-level synthesis system 101 executes pipeline high-level synthesis based on the assumption that a plurality of memory accesses can be made simultaneously in a single cycle (block S16). A pipeline circuit will be described using FIG. 4. That is, logics in a loop is separated with a plurality of pipeline registers and data is fed into the circuit in such a manner that an input at the time when the value of the loop variable i is 0, an input at the time when the value of the loop variable i is 1, an input at the time when the value of the loop variable i is 2, . . . are sequentially input from the left side.

This does not change the time (latency) required for calculating one iteration but increases the processing capability (throughput) for performing the entire calculation since a plurality of calculations can be performed one after another in an overlapped manner. This is an object of the pipelined structure.

However, in general, only one access can be made to one memory device in a single cycle, so that the pipelined structure cannot often be applied. If a dual-port memory is used, up to two accesses can be made in a single cycle. However, three accesses to the same array in a loop results in a conflict, resulting in abandonment of the pipeline structure in a general high-level synthesis tool.

On the other hand, in the processing according to the present embodiment, the pipeline high-level synthesis is temporarily executed on the assumption that a plurality of accesses can be made to the same memory in a single cycle. The memory access conflict is represented generally as shown in FIG. 5. Rows each including six boxes arranged laterally are arranged vertically in a staircase pattern such that each row is shifted to the right by a distance corresponding to the size of one box. Memory access positions are indicated in the boxes by a form of the array access. If two or more accesses to the same array appear in a vertical row, a memory access conflict occurs.

Then, the high-level synthesis system 101 determines whether a memory access conflict occurs or not (block S17). If it is determined to be "NO" (a memory access conflict does not occur), which means that it is possible to achieve a pipelined structure by a conventional high-level synthesis method. Therefore, the method according to the present embodiment need not be applied purposely. That is, the processing according to the present embodiment is ended (block S25).

If it is determined to be "YES" (a memory access conflict occurs), the high-level synthesis system 101 proceeds to block S18 and stores the pipeline cycle number $m$. If the capability (throughput) of the circuit needs to be maximized, 1 is set to the pipeline cycle number, as a matter of course. However, there is a trade-off, such that enhancement of the circuit capability involves increase in circuit area, so that an approach that reduces the circuit area while reducing the capability by increasing the pipeline cycle number is adopted in some cases. Thus, with $m$ set as the pipeline cycle number, the following processing blocks are performed.

Then, the high-level synthesis system 101 extracts all pipeline stage number differences between memory accesses and stores them (block S19). The pipeline stage number difference mentioned here will be described below with reference to FIG. 4. In the example of FIG. 4, two array accesses, i.e., two memory accesses exist in a loop (in this case, both accesses are memory READ).

That is, FIG. 4 shows a state in which accesses to A[i] and A[i+5] are assigned in a pipelined circuit. In this case, three pipeline registers (boxes) are inserted between the two accesses. Therefore, the pipeline stage number difference in this case is 3. This stage number difference is determined by the high-level synthesis tool in consideration of scheduling or assignment of computing units and, in general, a designer, who is a user of the high-level synthesis tool, cannot control the stage number.

Then, the high-level synthesis system 101 calculates a required buffer register size based on the information described above (block S20). The calculation expression of the buffer register size is as follows.

$$|Cy-Cx-(n<Cx-Cy>/m) \times s|+1 \qquad (1)$$

A detailed description will be given of the expression (1). Cx and Cy are values to be added to the loop variable in the subscript of the array access, that is, constant terms. For example, assume that array access A[i+Cx] and A[i+Cy] appear in "for loop" in the order mentioned. As a result of high-level synthesis, these A[i+Cx] and A[i+Cy] are assigned in a pipelined circuit and the pipeline stage number difference between two memory accesses becomes n<Cx−Cy>. Note that "<" and ">" are used merely as notation, not representing the magnitude relation.

m is pipeline cycle number and s is step number of the loop variable. In order to avoid a conflict between two memory accesses using the buffer register, it is necessary for the buffer register to have a size represented by the above expression (1). Cx, Cy, and s can have a negative value, whereas n<Cx−Cy> (block number difference) and m (pipeline cycle number) have always a positive value. The area between the vertical bars ("|") appearing in the expression represents an absolute value.

Then, the high-level synthesis system 101 performs calculation of block S20 for all memory access pairs. Since the buffer register size actually required is the largest one among the calculation results, the largest one of a plurality of obtained buffer register sizes is adopted (block S21).

Then, the high-level synthesis system 101 connects combinational logic parts including memory accesses between the pipeline registers and a buffer register. To this end, the high-level synthesis system 101 calculates the position of the buffer register to which the memory access part in each combinational logic part is connected (block S22). The calculation expression is as follows.

$$Clast-Cp-(n<Cp-Clast>/m \times s) \qquad (2)$$

In the above expression (2), meaning of symbols are substantially the same as in the expression (1). Clast is a constant term part in the subscript for the last memory access in a loop. Cp is a constant term part of the subscript for the memory access whose connection position needs to be calculated. n<Cp−Clast> is a pipeline stage number difference between combinational logic parts respectively including the last memory access in a loop and memory access whose connection position needs to be calculated. m and s have the same meaning as those in the expression (1). Therefore, these values are always 0 for the last memory access in a loop.

The above expression is calculated for all memory accesses and stores differences between respective calculated values and the smallest value (this can be a negative value) thereamong in association with each combinational logic part.

Then, the high-level synthesis system 101 assigns a number to each element in the buffer register (block S23). If the step number s of the loop variable is a positive value, numbers 0, 1, 2, . . . are assigned from the top of the buffer register to the end thereof. If the step number s of the loop variable is a negative value, numbers 0, 1, 2, . . . are assigned from the end of the buffer register to the top thereof.

After that, the high-level synthesis system 101 connects each combinational logic to the connection position calculated in block S22 such that if each memory access is READ, data flows from the buffer register to combinational logic, while if each memory access is WRITE, data flows from the combinational logic to buffer register.

Then, the high-level synthesis system 101 generates an entire control circuit (block S24) and ends the processing (block S25). That is, what is required in addition to the circuits that have been created up to the previous step are a circuit that reads out data for each cycle from a memory to buffer register for shift-in of data (increments (if the block number of the loop variable is positive) or decrements (if the step number of the loop variable is negative) a read out address every cycle), a circuit that writes data which has been shifted out for each cycle from a buffer register to a memory, and a circuit that adjusts the start and end timing of the above processing.

If there is only READ (i.e., memory READ) access for reading data from the array in a loop, a circuit for writing data from the buffer register to memory is not necessary. Similarly, if there is only WRITE access for writing data to the array in a loop, a circuit for reading data from the memory for shift-in of data to the buffer register is not necessary. If there are both READ and WRITE accesses to the same array in a loop, read and write operations from/to the memory need to be performed in the same cycle. This case involves the introduction of a dual-port memory. Otherwise, it is not necessary to introduce the dual-port memory.

While the typical processing operation has been described above, concrete examples will be described below. The following description will be given of what type of circuit the above numeric expressions constitute.

FIGS. 6A to 6E show a first concrete example. As shown in FIG. 6A, there are two READ accesses to the same array in a loop. If one-cycle pipeline structure is applied to this, a memory access conflict occurs as shown in FIG. 6B.

Here, the above expressions (1) and (2) are calculated. The calculation results are shown in FIG. 6C. That is, [C2−C1] is 5, and [n<C1−C2>] is 3. m is 1 and s is also 1. The size of the buffer register is 3, and connection positions are 2 and 0. Since the step number is positive, numbers 0, 1, and 2 are assigned to the buffer register from the top thereof. Then the circuits are connected as shown in FIG. 6D.

FIG. 6E shows a state in which a value is read from the memory every cycle to be shifted in to the buffer register. That is, when the top of the data to be calculated reaches the position of A[i] of the pipelined circuit (in the case where i=0), the values of A[0], A[1], and A[2] are stored in the 2nd, 1st, and 0th positions of the buffer resister, respectively. The connection condition surely reveals that it is possible to perform calculation by using the value of A[0] in the combinational logic part of A[i].

Three cycles after this, the top of the data to be calculated reaches the position of A[i+5] (in the case where i=0). At this time, the data to be calculated when i=3 reaches the position of A[i]. Referring to FIG. 6E, the value of A[3] can be read from A[i] and the value of A[5] can be read from A[i+5]. The same is applied to the following operation. Thus, by appropriately controlling the start and end of the operation, one-cycle pipeline structure can be achieved.

FIGS. 7A to 7E show a second concrete example. This shows an example in which there is only READ access to the array as in the case of the first example (FIGS. 6A to 6E). A different point is that there are three array accesses as shown in FIG. 7A. If the pipelined structure is applied to this, a memory access conflict occurs as can be understood from the staircase pattern of FIG. 7B.

Here, the above expressions (1) and (2) are calculated. The calculation results are shown in FIG. 7C. That is, [C2−C1] is −5, [C3−C1] is −2, and [C3−C2] is 3. [n<C1−C2>] is 3, [n<C1−C3>] is 5, and [n<C2−C3>] is 2. m is 1 and s is also 1.

Three calculation results 9, 8, 2 are obtained as to the buffer size, and the largest one of them, i.e., 9 is set to the buffer register size. Further, when the connection positions are calculated according to the expression (2), values of −7, 1, 0 are obtained, and theses values are represented by differences from the smallest value among them, i.e., −7, with the result that connection positions are 0, 8, and 7. Thus, as shown in FIG. 7D, A[i+5], A[i+3], and A[i] are connected to the 0th, 7th, and 8th positions of the buffer register, respectively.

FIG. 7E shows a state in which a value is read out from the memory every cycle to be shifted in to the buffer register. That is, when the top of the data to be calculated reaches the position of A[i+5] of the pipelined circuit (in the case where i=0), the value of A[5] is just stored in the 0th position of the buffer resister. Thus, it is possible to perform calculation by using the value of A[5] in the part of A[i+5].

Three cycles after this, the value of A[0] is supplied to the position of A[i]. At this time, the value of A[8] is supplied to the position of A[i+5]. In this case, since A[i] uses A[i] when i=0, this is true. Further, A[i+5] is used in the calculation to be made when i=3, the use of A[8] is also true.

A further two cycles after this, calculation to be made when i=0 reaches the position of A[i+3]. At this time, A[3] is stored in the corresponding position of the buffer register. This also shows that the data to be used for calculation is true. The same is applied to the following operation. Thus, by appropriately controlling the start and end of the operation, one-cycle pipeline structure can be achieved.

FIGS. 8A to 8E show a third concrete example. This third concrete example is a very complicated one. As shown in FIGS. 8A and 8B, there are four array accesses, and READ and WRITE accesses are mixed together. The step number of loop variable is −2. Here, the pipeline cycle number is set to 2.

The calculation results are all shown in FIG. 8C. That is, the buffer register size results in 22, and connection positions result in 20, 21, 8, and 0. Thus, as shown in FIG. 8D, A[i+2], A[i−1], A[i+6] and A[i+8] are connected to the 20th, 21st, 8th and 0th positions of the buffer register, respectively. Note that since the step number of the loop variable is negative, the numbers of the buffer register are assigned in the reverse order to that in the first concrete example (FIGS. 6A to 6E) and second concrete example (FIGS. 7A to 7E).

Since both memory READ and memory WRITE occur, a dual port memory is used in this case. That is, the data is read out from the memory and shifted in to the buffer register and, at the same time, the data shifted but from the buffer register is written into the corresponding address in the memory.

The transition of values in the buffer register is shown in FIG. 8E. That is, at the time when the value of A[102] is shifted and reaches the position to which A[i+2] is connected, calculation is started. At this time, since A[i+2] is memory WRITE, the value of A[102] which has been read from the memory is rewritten in the buffer register.

Two cycles after this, the calculation flow reaches the position of A[i−1]. At this time, A[i−1] reads out the value of A[99] and, at the same time, A[i+2] writes the value of A[100]. The following operations are as follows. At the time when the calculation flow reaches the position of A[i+6], A[i+6] overwrites the value of A[106] and, in this cycle, A[i−1] performs calculation using the value of A[93], and A[i+2] overwrites the value of A[94]. Further follow up of the transition of values helps to confirm that overwrite or read of the array element is correctly performed. Further, in this case, it is possible to achieve a two-cycle pipeline, i.e., a circuit that can output a meaningful calculation result every two cycles.

In the above examples shown in FIGS. 6A to 6E, FIGS. 7A to 7E, and FIGS. 8A to 8E, the ratio between the pipeline cycle number and loop variable step number is 1:1, so that data from the memory can be shifted in to the buffer register every cycle or data can be shifted out from the buffer register every cycle. However, in the case where the above ratio is not 1:1, the control method slightly differs from the above examples. There is no problem as to the buffer register amount or connection position since it is possible to apply the method described above without change. However, a little modification is required as to the shift method of the buffer register. This point will be described using a fourth concrete example shown in FIGS. 9A to 9E.

As shown in FIGS. 9A and 9B, the loop variable step number is set to 2 and pipeline cycle number is set to 3 in the fourth concrete example. FIG. 9C shows a calculation result, FIG. 9D shows a connection relationship, and FIG. 9E shows a state in which the buffer register is filled with data. As can be seen from the staircase part of FIG. 9E, three cycles after the arrival of calculation requiring A[0] to the position of A[i], calculation requiring A[2] reaches the positions of A[i] and calculation requiring A[5] reaches the positions of A[i+5]. However, in the buffer register, two-cycle is set between the two statuses. Therefore, it is necessary to create a control circuit that shifts the buffer register by two positions during three cycles.

As described above, the size of the buffer register can be calculated in the above concrete examples. Accordingly, by controlling the schedule of the pipeline stage so as to minimize the buffer register size, it is possible to further reduce the circuit area while maintaining a high throughput.

The calculation expression of the buffer register size can be reduced by 1 in comparison with the expression (1). This indicates the case where, when data is read at a plurality of positions from the same memory in the same cycle, a memory access conflict does not occur even if a buffer is absent since the same address is accessed. Since the present embodiment regards such a particular case as a memory access conflict and inevitably generates a buffer register, 1 is added to the calculation expression. However, if the address is the same, the above case is not actually a memory access conflict. On the other hand, if the buffer register is not generated in such a case, the generation of the entire control circuit in block S24 of FIG. 2 becomes more complicated. Thus, when the present invention is realized as a high-level synthesis CAD tool, manufacturability of the tool, configurations of circuits to be generated, and the like need to be taken into consideration.

According to the above embodiment, by automatically inserting a buffer register between the memory and pipelined circuit, it is possible to prevent a memory access conflict and to automatically perform high-level synthesis of many types of algorithm descriptions mainly for video image with a pipelined circuit. As a result, it is possible to significantly increase the probability of generating a circuit that can achieve desired capability. Although a certain restriction is imposed on the subscript of the array access for success of the method according to the present embodiment, this restriction is fully allowable in the video image algorithm. Further, when the pipelined structure is to be implemented, one-cycle pipelined structure can be achieved without fail.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pipeline high-level synthesis system comprising:
   a first circuit section which receives a high-level description and performs pipeline high-level synthesis for its loop description part to generate a pipelined circuit having a structure in which a plurality of combinational logic parts serially arranged are separated by pipeline registers; and
   a second circuit section which, if a memory access conflict is caused by a plurality of combinational logic parts including memory accesses in the circuit generated by the first circuit section, allows the logic parts in which a memory access conflict occurs to access a memory through a shift register having a size corresponding to the combinational logic parts.

2. The pipeline high-level synthesis system according to claim 1, wherein
   the second circuit section sets the size of the shift register based on a subscript of each array access part written in the loop description part, step number of a loop variable written in the loop description part, pipeline stage number difference among a plurality of combinational logic parts including memory accesses, and pipeline cycle number.

3. The pipeline high-level synthesis system according to claim 2, wherein
   the second circuit section calculates the size of the shift register according to the following expression:

$|C_y - C_x - (n<C_x-C_y>/m) \times s| + 1$ where Cy and Cx are values to be added to the loop variable in the subscripts of two array accesses between which a memory access conflict occurs, s is step number of the loop variable written in the loop description part, $n<C_x-C_y>$ is pipeline stage number difference between two combinational logic parts between which a memory access conflict occurs, and m is pipeline cycle number.

4. The pipeline high-level synthesis system according to claim 1, wherein
   the second circuit section sets the size of the shift register and a position of the combinational logic parts including memory accesses to which the shift resister is connected based on a subscript of each array access part written in the loop description part, step number of a loop variable written in the loop description part, pipeline stage number difference among a plurality of combinational logic parts including memory accesses, and pipeline cycle number.

5. The pipeline high-level synthesis system according to claim 4, wherein
   the second circuit section calculates the size of the shift register according to the following expression:

$|C_y - C_x - (n<C_x-C_y>/m) \times s| + 1$ where Cy and Cx are values to be added to the loop variable in the subscripts of two array accesses between which a memory access conflict occurs, s is step number of the loop variable written in the loop description part, $n<C_x-C_y>$ is pipeline stage number difference between two combinational logic parts between which a memory access conflict occurs, and m is pipeline cycle number, and calculates the position of the combinational logic parts including memory accesses to which the shift resister is connected according to the following expression:

$C_{last} - C_p - (n<C_p - C_{last}>/m) \times s$ where Clast is a value to be added to the loop variable in the subscript of the array access part performing a last memory access in a loop, Cp is a value to be added to the loop variable in the subscript whose connection position to the shift register needs to be calculated, and $n<C_p-C_{last}>$ is pipeline stage number difference between combinational logic part respectively including the last memory access in a loop and combinational logic part whose connection position to the shift register needs to be calculated.

6. A pipeline high-level synthesis method comprising:
   a first block of receiving a high-level description and performing pipeline high-level synthesis for its loop description part to generate a pipelined circuit having a structure in which a plurality of combinational logic parts serially arranged are separated by pipeline registers; and
   a second block of, if a memory access conflict is caused by a plurality of combinational logic parts including memory accesses in the circuit generated by the first block, allowing the logic parts in which a memory access conflict occurs to access a memory through a shift register having a size corresponding to the combinational logic parts.

7. The pipeline high-level synthesis method according to claim 6, wherein
   the second block sets the size of the shift register based on a subscript of each array access part written in the loop description part, step number of a loop variable written in the loop description part, pipeline stage number difference among a plurality of combinational logic parts including memory accesses, and pipeline cycle number.

8. The pipeline high-level synthesis method according to claim 7, wherein
   the second block calculates the size of the shift register according to the following expression:

$|C_y - C_x - (n<C_x-C_y>/m) \times s| + 1$ where Cy and Cx are values to be added to the loop variable in the subscripts of two array accesses between which a memory access conflict occurs, s is step number of the loop variable written in the loop description part, $n<C_x-C_y>$ is pipeline stage number difference between two combinational logic parts between which a memory access conflict occurs, and m is pipeline cycle number.

9. The pipeline high-level synthesis method according to claim 6, wherein
   the second block sets the size of the shift register and a position of the combinational logic parts including memory accesses to which the shift resister is connected based on a subscript of each array access part written in the loop description part, step number of a loop variable written in the loop description part, pipeline stage number difference among a plurality of combinational logic parts including memory accesses, and pipeline cycle number.

10. The pipeline high-level synthesis method according to claim 9, wherein
    the second block calculates the size of the shift register according to the following expression:

$|C_y - C_x - (n<C_x-C_y>/m) \times s| + 1$ where Cy and Cx are values to be added to the loop variable in the subscripts of two array accesses between which a memory access conflict occurs, s is step number of the loop variable written in the loop description part, $n<C_x-C_y>$ is pipeline stage number difference between two combinational logic parts between which a memory access conflict occurs, and m is pipeline cycle number, and calculates the position of the combinational logic parts including memory accesses to which the shift register is connected according to the following expression:

$$\text{Clast} - \text{Cp} - (n\langle \text{Cp}-\text{Clast}\rangle / m) \times s$$

where Clast is a value to be added to the loop variable in the subscript of the array access part performing a last memory access in a loop, Cp is a value to be added to the loop variable in the subscript whose connection position to the shift register needs to be calculated, and $n\langle \text{Cp}-\text{Clast}\rangle$ is pipeline stage number difference between combinational logic part respectively including the last memory access in a loop and combinational logic part whose connection position to the shift register needs to be calculated.

* * * * *